(12) United States Patent
Chang et al.

(10) Patent No.: US 11,177,377 B2
(45) Date of Patent: Nov. 16, 2021

(54) SEMICONDUCTIVE DEVICE WITH MESA STRUCTURE AND METHOD OF FABRICATING THE SAME

(71) Applicant: UNITED MICROELECTRONICS CORP., Hsin-Chu (TW)

(72) Inventors: Chun-Ming Chang, Kaohsiung (TW);
Wen-Jung Liao, Hsinchu (TW);
Chun-Liang Hou, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 42 days.

(21) Appl. No.: 16/726,263

(22) Filed: Dec. 24, 2019

(65) Prior Publication Data

US 2021/0167198 A1 Jun. 3, 2021

(30) Foreign Application Priority Data

Dec. 2, 2019 (CN) .......................... 201911211806.4

(51) Int. Cl.
| | |
|---|---|
| *H01L 29/778* | (2006.01) |
| *H01L 29/20* | (2006.01) |
| *H01L 29/205* | (2006.01) |
| *H01L 29/06* | (2006.01) |
| *H01L 29/66* | (2006.01) |
| *H01L 21/265* | (2006.01) |
| *H01L 21/306* | (2006.01) |
| *H01L 21/02* | (2006.01) |
| *H01L 29/34* | (2006.01) |

(52) U.S. Cl.
CPC .... *H01L 29/7786* (2013.01); *H01L 21/02241* (2013.01); *H01L 21/02247* (2013.01); *H01L 21/2654* (2013.01); *H01L 21/30612* (2013.01); *H01L 29/0661* (2013.01); *H01L 29/2003* (2013.01); *H01L 29/205* (2013.01); *H01L 29/34* (2013.01); *H01L 29/66462* (2013.01)

(58) Field of Classification Search
CPC ..... H01L 29/30; H01L 29/34; H01L 21/0415; H01L 21/046–047; H01L 21/2253; H01L 21/265–266; H01L 21/3115–31155; H01L 21/3215–32155; H01L 21/425–426; H01L 21/76825; H01L 21/76859; H01L 21/76862; H01L 29/66431; H01L 29/66462; H01L 29/778–7789; H01L 2924/13064; H01L 29/122–127; H01L 29/15–158
See application file for complete search history.

(56) References Cited

U.S. PATENT DOCUMENTS 7,851,284 B2 12/2010 Zhang
8,062,931 B2 11/2011 Lorenz
(Continued)

FOREIGN PATENT DOCUMENTS

CN 106257686 A 12/2016

*Primary Examiner* — Scott B Geyer
(74) *Attorney, Agent, or Firm* — Winston Hsu

(57) ABSTRACT

A mesa structure includes a substrate. A mesa protrudes out of the substrate. The mesa includes a slope and a top surface. The slope surrounds the top surface. A lattice damage area is disposed at inner side of the slope. The mesa can optionally further includes an insulating layer covering the lattice damage area. The insulating layer includes an oxide layer or a nitride layer.

10 Claims, 9 Drawing Sheets

(56) References Cited

U.S. PATENT DOCUMENTS 9,496,137 B2 11/2016 Chu
2013/0099324 A1* 4/2013 Huang ................ H01L 21/2654
257/401

* cited by examiner

SEMICONDUCTIVE DEVICE WITH MESA STRUCTURE AND METHOD OF FABRICATING THE SAME

BACKGROUND OF THE INVENTION

1. Field of the Invention

The present invention relates to a mesa structure and a method of fabricating the same, and more particularly to a mesa structure with a lattice damage area disposed on a slope and a method of fabricating the same.

2. Description of the Prior Art

Due to their semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different bandgaps are combined and a heterojunction is formed at the junction between the semiconductor materials as a channel for carriers. In recent years, gallium nitride based materials have been applied in high power and high frequency products because of their properties of wider band-gap and high saturation velocity.

A two-dimensional electron gas (2DEG) may be generated by the piezoelectric property of the GaN-based materials, and the switching velocity may be enhanced because of the higher electron velocity and the higher electron density of the 2DEG However, while forming the gate electrode of an HEMT, the gate electrode often contacts the 2DEG and lead to short circuit.

SUMMARY OF THE INVENTION

According to a preferred embodiment of the present invention, a semiconductor structure with a mesa structure includes a mesa structure. The mesa structure includes a substrate. A mesa protrudes from the substrate, wherein the mesa includes a slope and a top surface and the slope surrounds the top surface. A lattice damage area is disposed at an inner side of the slope.

A fabricating method of a semiconductor structure with a mesa structure includes providing a substrate and a semiconductor stacked layer covering the substrate. Next, the semiconductor stacked layer is etched to form a plurality of trenches, wherein the semiconductor stacked layer disposed between two of the trenches adjacent to each other forms a mesa. Later, the trenches are bombarded to form a lattice damage area in two sidewalls and a bottom of each of the trenches.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 10 depict a fabricating method of a semiconductor structure with a mesa structure according to a preferred embodiment of the present invention, wherein:
FIG. 1 depicts a step of providing a substrate;
FIG. 2 depicts a fabricating stage following FIG. 1;
FIG. 3 depicts a three-dimensional diagram of one of mesas shown in FIG. 2;
FIG. 4 depicts a fabricating stage following FIG. 2;
FIG. 5 depicts a three-dimensional diagram of a mesa and a lattice damage area shown in FIG. 4;
FIG. 6 depicts a fabricating stage following FIG. 4;
FIG. 7 depicts a three-dimensional diagram of a mesa, a lattice damage area and an insulating layer shown in FIG. 6;
FIG. 8 depicts a fabricating stage following FIG. 6;
FIG. 9 depicts a fabricating stage following FIG. 8;
and
 FIG. 10 depicts a step of forming a gate electrode after a source electrode and a drain electrode are completed.

DETAILED DESCRIPTION

FIG. 1 to FIG. 10 depict a fabricating method of a semiconductor structure with a mesa structure according to a preferred embodiment of the present invention.

Figure 1:
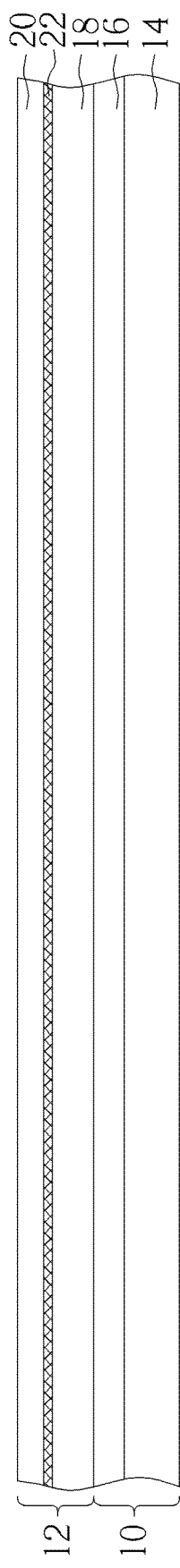

As shown in FIG. 1, a substrate 10 is provided. A semiconductor stacked layer 12 covers the substrate 10. The substrate 10 includes a semiconductor substrate 14 and a buffer layer 16. The buffer layer 16 covers the semiconductor substrate 14. The semiconductor substrate 14 may be a silicon substrate, a sapphire substrate or a silicon on insulator (SOI). The semiconductor stacked layer 12 covers the buffer layer 16. The semiconductor stacked layer 12 includes at least two different III-V semiconductor layers. The III-V semiconductor layers respectively include aluminum nitride, aluminum gallium nitride or gallium nitride. For example, the III-V semiconductor layers include a gallium nitride layer 18 and an aluminum gallium nitride 20. The aluminum gallium nitride 20 is disposed on the gallium nitride layer 18. A two dimensional electron gas (2DEG) 22 is generated in the gallium nitride layer 18 and the aluminum gallium nitride layer 20. The buffer layer 16 may be gallium nitride.

Figure 2:
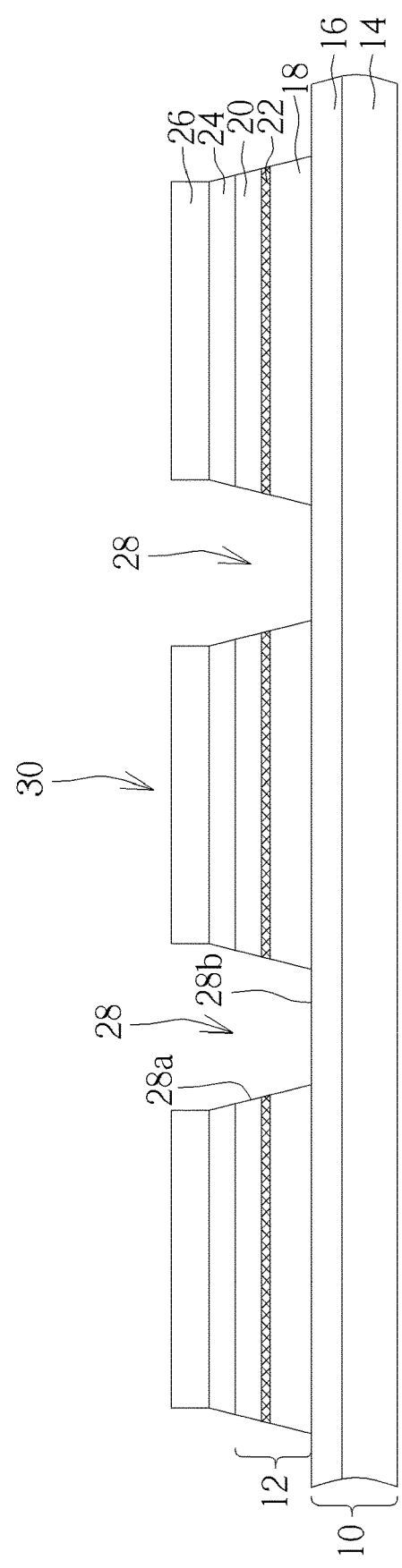

As shown in FIG. 2, three-dimensional coordinates are shown at the bottom left of FIG. 2. Three-dimensional coordinates define three directions, such as a first direction D1, a second direction D2 and a third direction D3. A hard mask 24 is formed to cover the semiconductor stacked layer 12. Later, a photoresist 26 is formed to cover the hard mask 24. Then, the photoresist 26 is patterned. Next, the hard mask 24 is patterned by taking the photoresist 26 as a mask. Subsequently, the semiconductor stacked layer 12 is etched to form numerous trenches 28 by taking the photoresist 26 and the hard mask 24 as masks. A mesa 30 is defined by the semiconductor stacked layer 12 between two adjacent trenches 28. A depth of each of the trenches 28 should be greater than a depth of the 2DEG 22. In other words, the trenches 28 segment the 2DEG 22. According to a preferred embodiment of the present invention, the depth of each of the trenches 28 is greater than the depth of the gallium nitride layer 18. That is, the buffer layer 16 serves as a bottom of each of the trenches 28.

Figure 3:
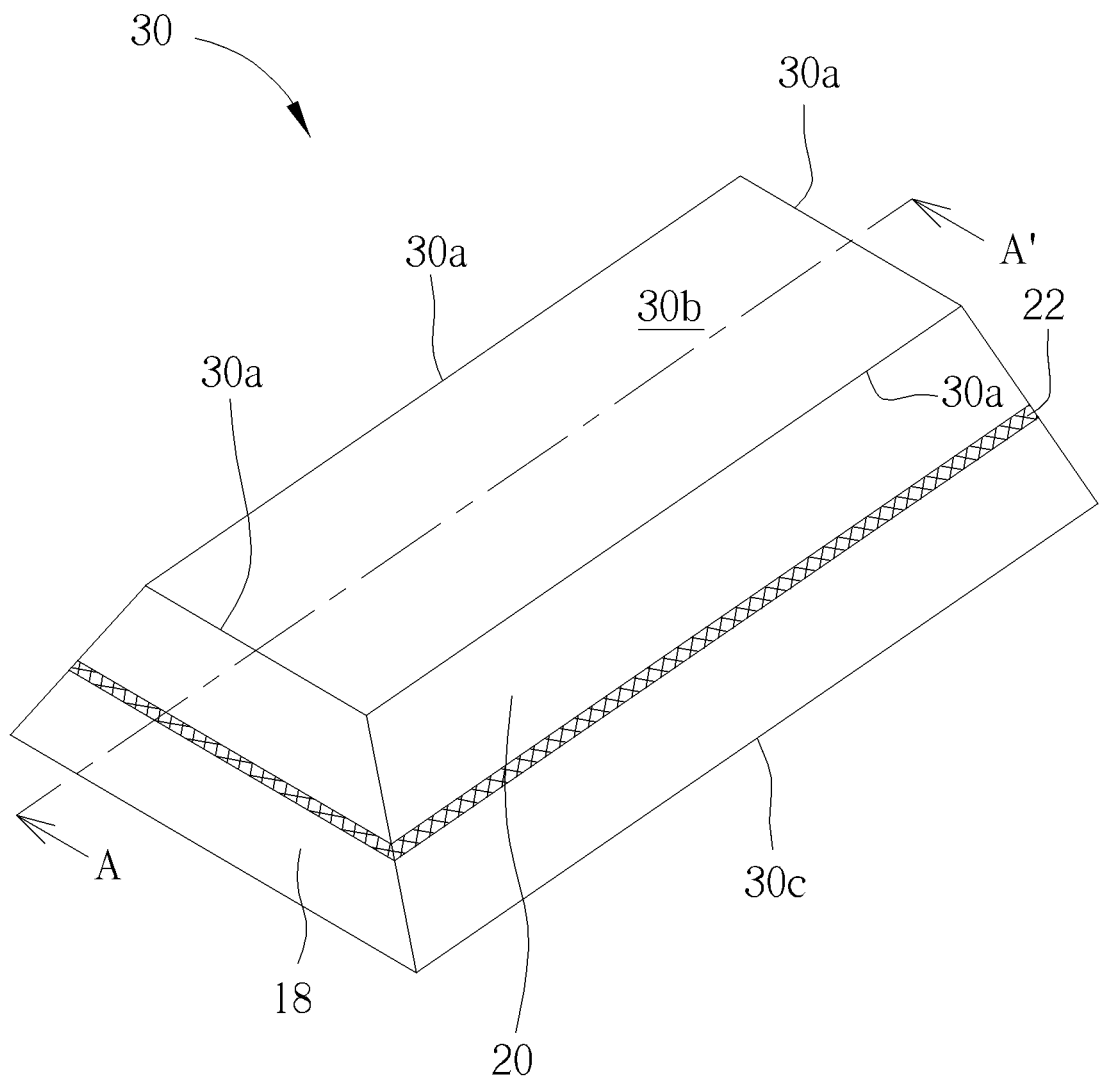
Figure 3:
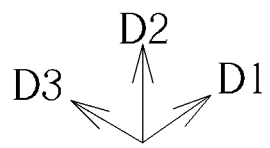
Figure 11:
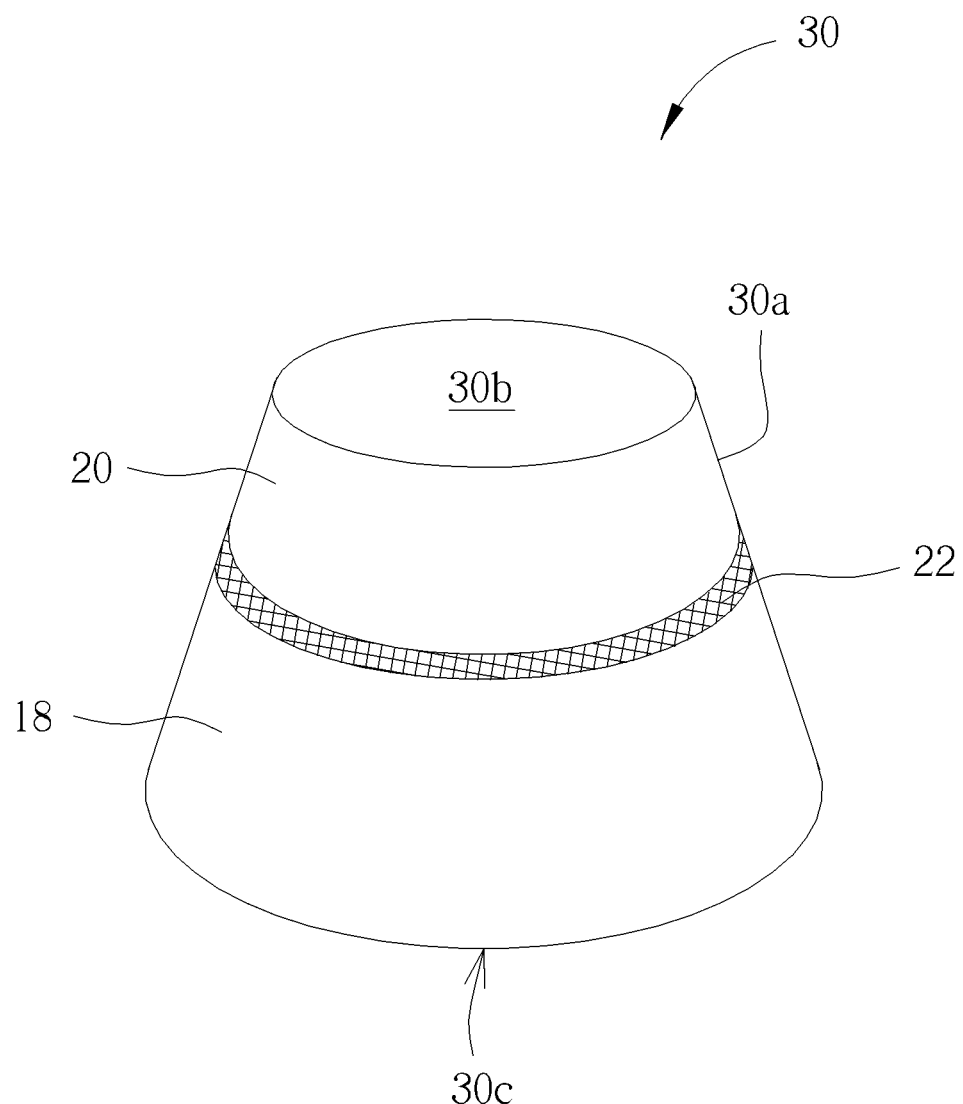
FIG. 11 depicts a modified shape of a mesa.

FIG. 3 depicts a three-dimensional diagram of one of mesas shown in FIG. 2. For the sake of clarity, the hard mask and the photoresist are omitted in FIG. 3. A sectional view taken along a line AA' in FIG. 3 corresponds to the mesa at the middle of FIG. 2. As shown in FIG. 3, the mesa 30 is a three-dimensional trapezoid. The three-dimensional trapezoid includes a slope 30a, a top surface 30b and a bottom 30c. The top surface 30b and the bottom 30c are parallel to each other. The area of the top surface 30b is smaller than the area of the bottom 30c. The slope 30a surrounds the top surface 30b and the bottom 30c. The 2DEG 22 is exposed on the slope 30a. However, according to a different embodiment of the present invention, the mesa 30 can be a truncated cone as shown in FIG. 11. The elements of FIG. 11 which are substantially the same as those in the embodiment of FIG. 3 are denoted by the same reference numerals; an accompanying explanation is therefore omitted. The mesa 30 in FIG. 11 is a truncated cone. The mesa 30 also includes a slope 30a, a top surface 30b and a bottom 30c. The top surface 30b and the bottom 30c are parallel to each other. The area of the top surface 30b is smaller than the area of the bottom 30c. The following description will take the mesa 30 in FIG. 3 as an example.

Figure 4:
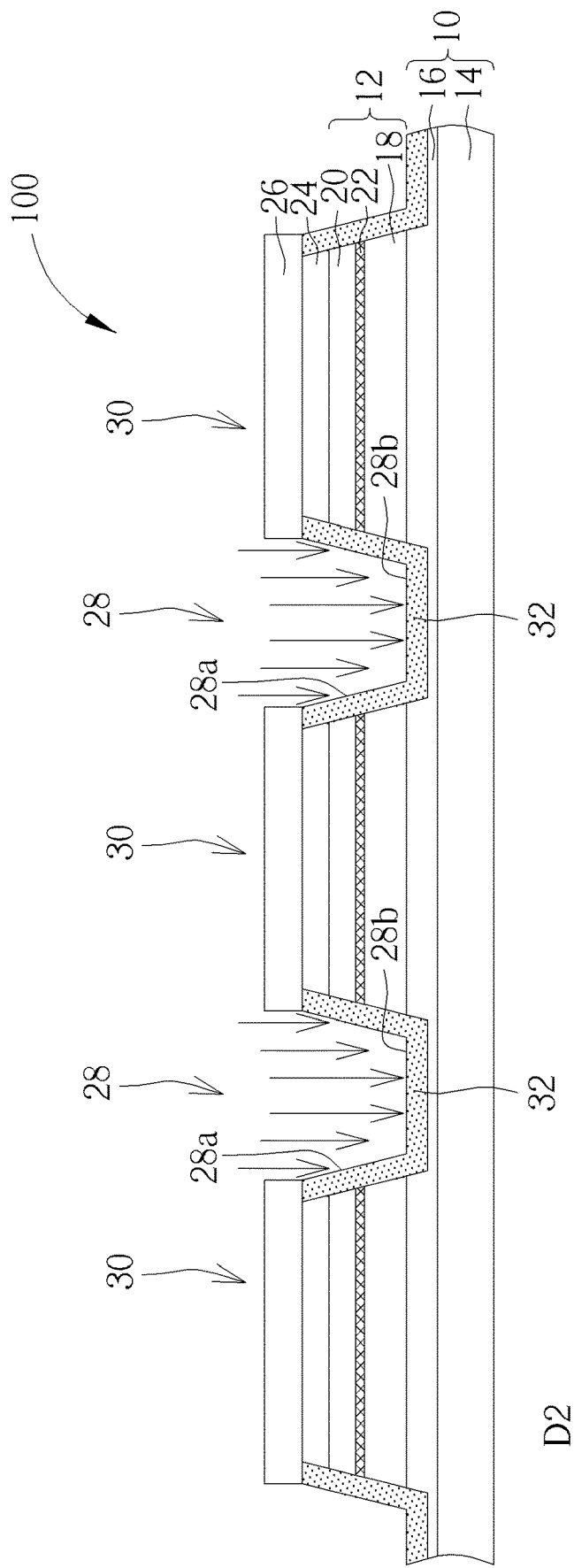

As shown in FIG. 4, each of the trenches 28 is bombarded by ions to form a lattice damage area 32 in two sidewalls 28a and a bottom 28b thereon by taking the photoresist 26 and the hard mask 24 as masks. In details, during the ion bombardment, nitrogen, oxygen, hydrogen, fluorine, helium, argon, magnesium, zinc, phosphorus, iron, krypton, xenon-131, boron or arsenic is used to bombard the sidewalls 28a and the bottom 28b so as to destroy the lattice structure at the inner side of the sidewalls 28a and the bottom 28b to form the lattice damage area 32. The thickness of the lattice damage area 32 is smaller than 50 nanometers. That is, the depth of the ion bombardment is smaller than 50 nanometers. Because the lattice structure at the sidewalls 28a of the bottom 28b of the trench 28 is damaged (i.e., the wurtzite-type lattice structures of the gallium nitride layer 18 and the aluminum gallium nitride layer 20 are damaged), the 2DEG 22 can't be generated in the damaged lattice structure. That is, there is no 2DEG 22 within the lattice damage area 32. Now, a mesa structure 100 of the present invention is completed. The mesa structure 100 includes the substrate 10, the mesa 30 and the lattice damage area 32. Moreover, the photoresist 26 may be consumed up during the ion bombardment. In other ways, the photoresist 26 can be removed entirely after the ion bombardment by a cleaning process.

Figure 5:
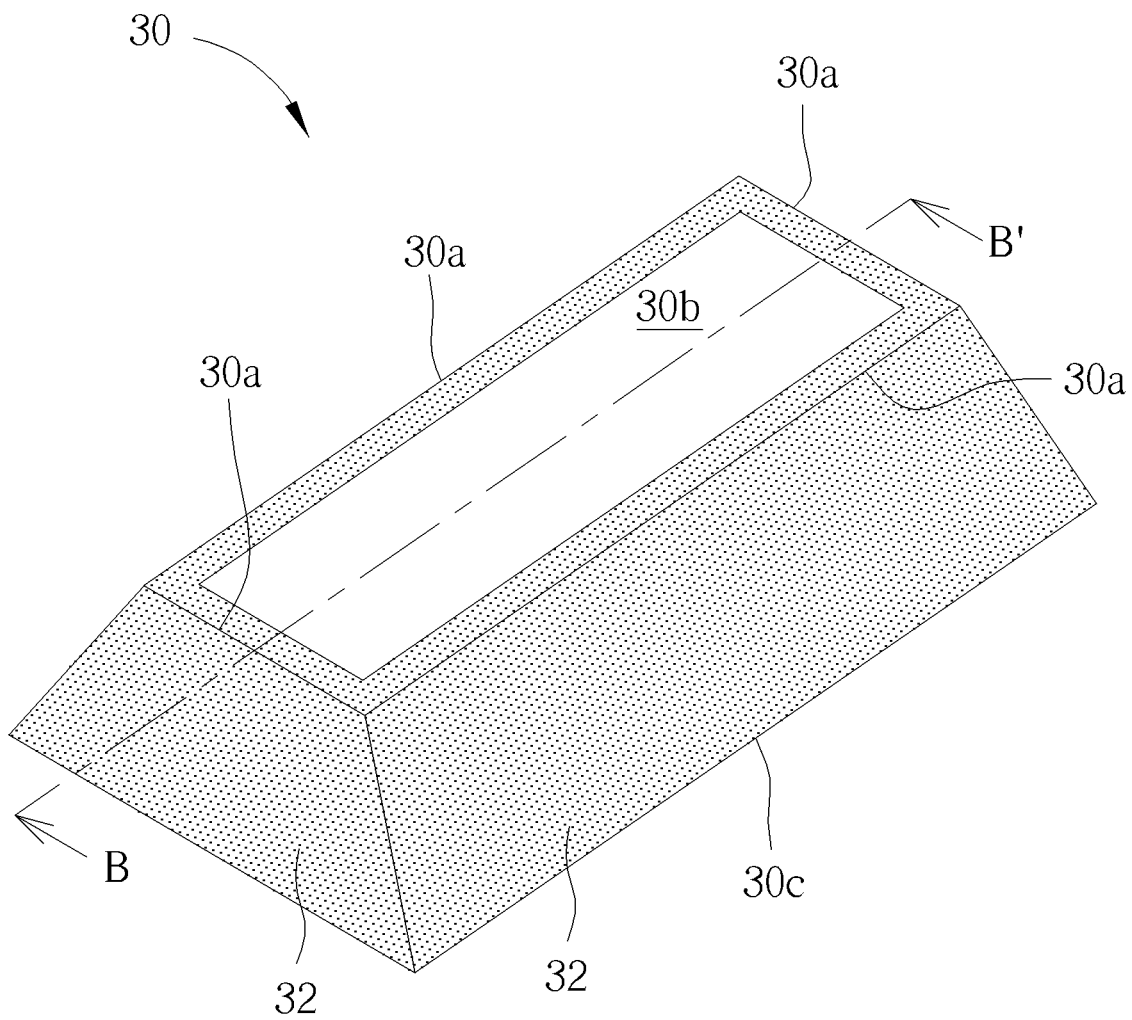

FIG. 5 depicts a three-dimensional diagram of a mesa and a lattice damage area shown in FIG. 4. For the sake of clarity, the hard mask and the photoresist are omitted in FIG. 5. A sectional view taken along a line BB' in FIG. 5 corresponds to the mesa and the lattice damage area at the middle of FIG. 4. Please refer to FIG. 3, FIG. 4 and FIG. 5, the lattice damage area 32 is disposed at the inner side of the slope 30a. The slope 30a is also the sidewall 28a of the trench 28. It is noteworthy that after the lattice damage area 32 is formed, there is no 2DEG 22 generated at the surface of the slope 30a.

Figure 6:
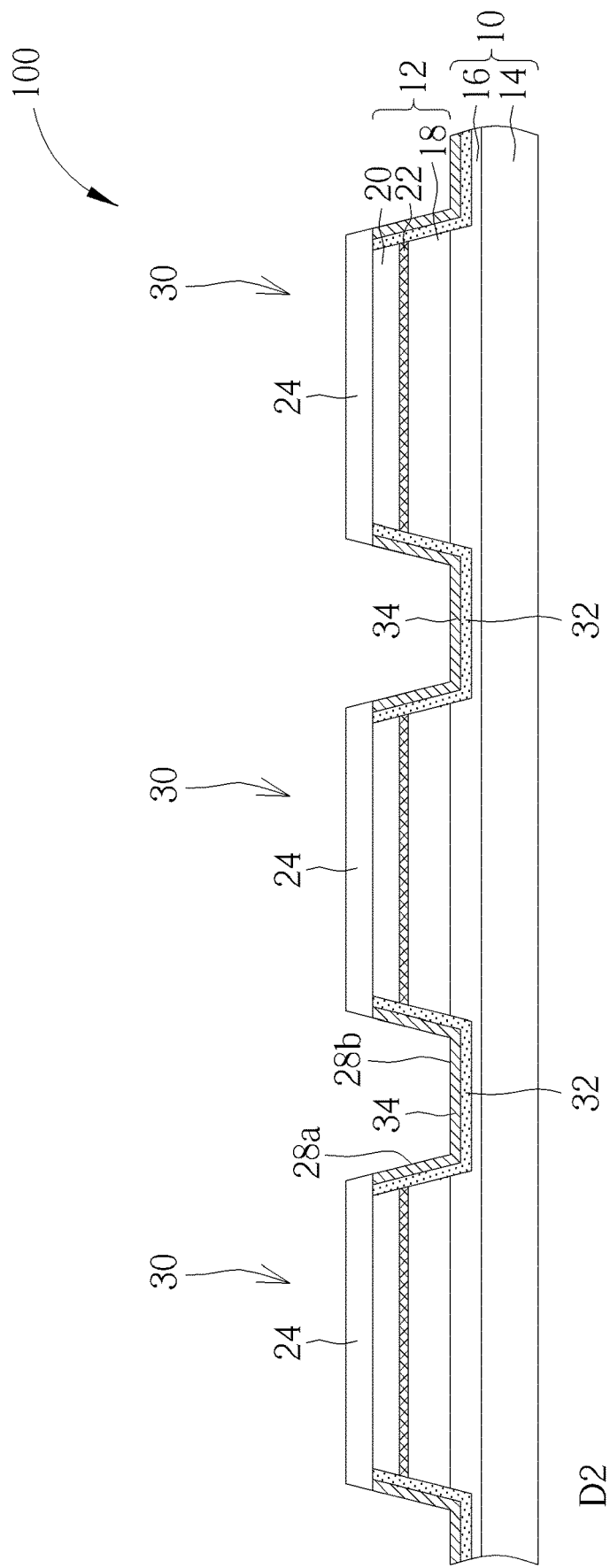

As shown in FIG. 6, after the lattice damage area 32 is formed, an insulating layer 34 can be formed at the sidewalls 28 and the bottom 28b of each of the trenches 28 based on different product requirements. The thickness of the insulating layer 34 is smaller than 5 nanometers. The method of forming the insulating layer 34 may include performing an oxidation process to form an oxide layer on the sidewalls 28a and the bottom 28b of each of the trenches 28 to serve as the insulating layer 34. In other ways, the insulating layer 34 may be formed by performing a nitridation process to form a nitride layer on the sidewalls 28a and the bottom 28b of each of the trenches 28 to serve as the insulating layer 34.

Figure 7:
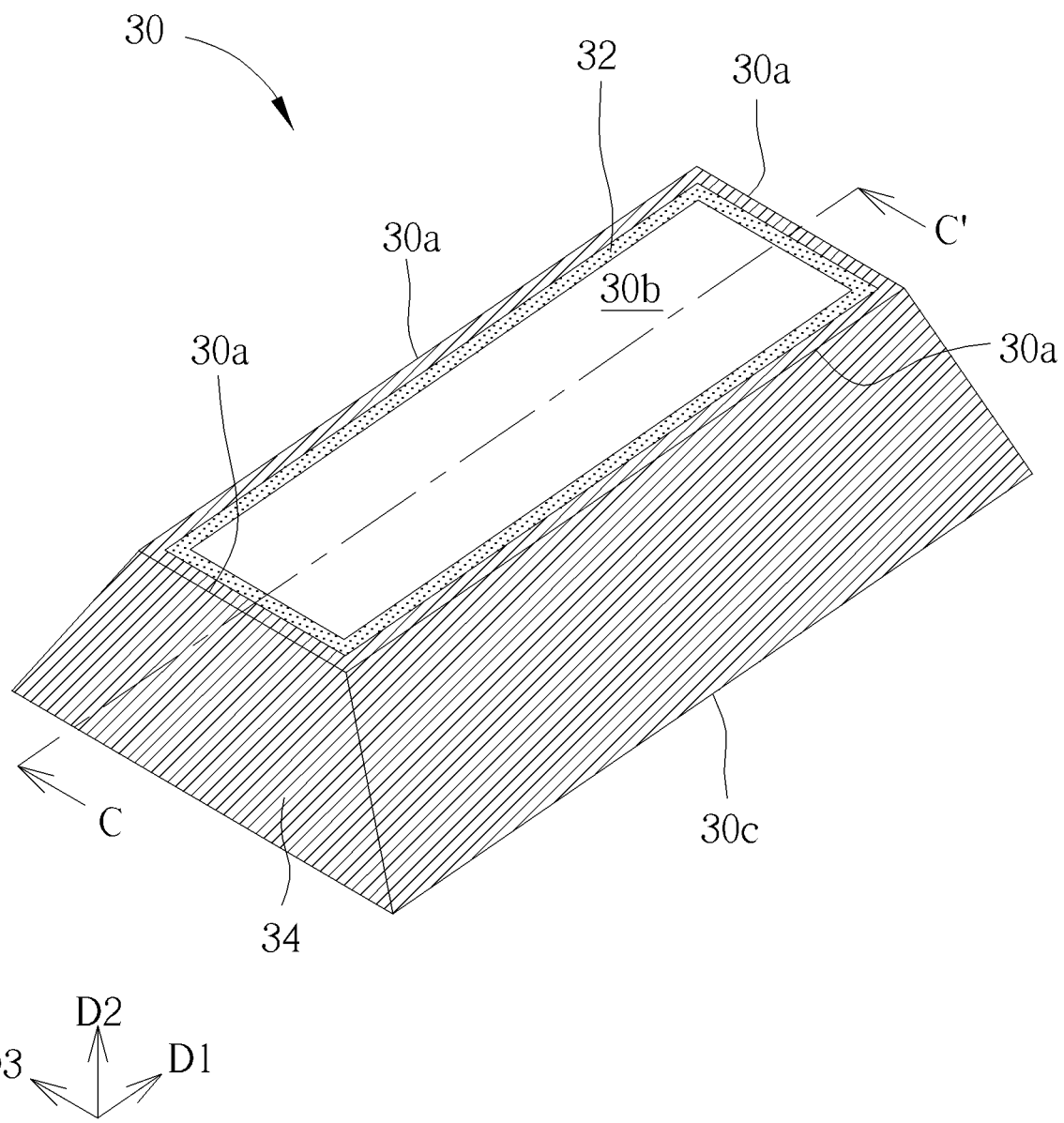

FIG. 7 depicts a three-dimensional diagram of a mesa, a lattice damage area and an insulating layer shown in FIG. 6. For the sake of clarity, the hard mask is omitted in FIG. 7. A sectional view taken along a line CC' in FIG. 7 corresponds to the mesa at the middle of FIG. 6. As shown in FIG. 7, the insulating layer 34 is disposed on the slope 30a and covers the lattice damage area 32.

Figure 8:
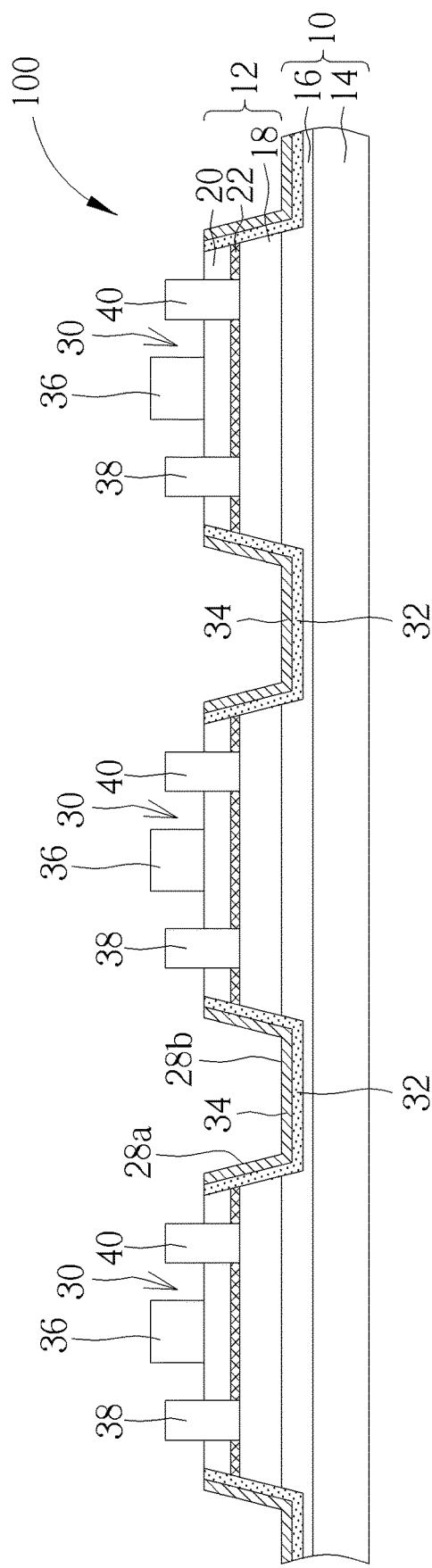

The mesa structure 100 can be used to form several types of semiconductor devices such as an HEMT. As shown in FIG. 8, after the mesa structure 100 is completed, the hard mask 24 is removed. Then, a gate electrode 36, a source electrode 38 and a drain electrode 40 are formed on the mesa 30. The mesa structure 100, the gate electrode 36, the source electrode 38 and the drain electrode 40 form an HEMT 42. The source electrode 38 and the drain electrode 40 are embedded in the aluminum gallium nitride layer 20. The gate electrode 36 is disposed on the surface of the aluminum gallium nitride layer 20. The source electrode 38 and the drain electrode 40 are respectively disposed at two sides of the gate electrode 36.

Figure 9:
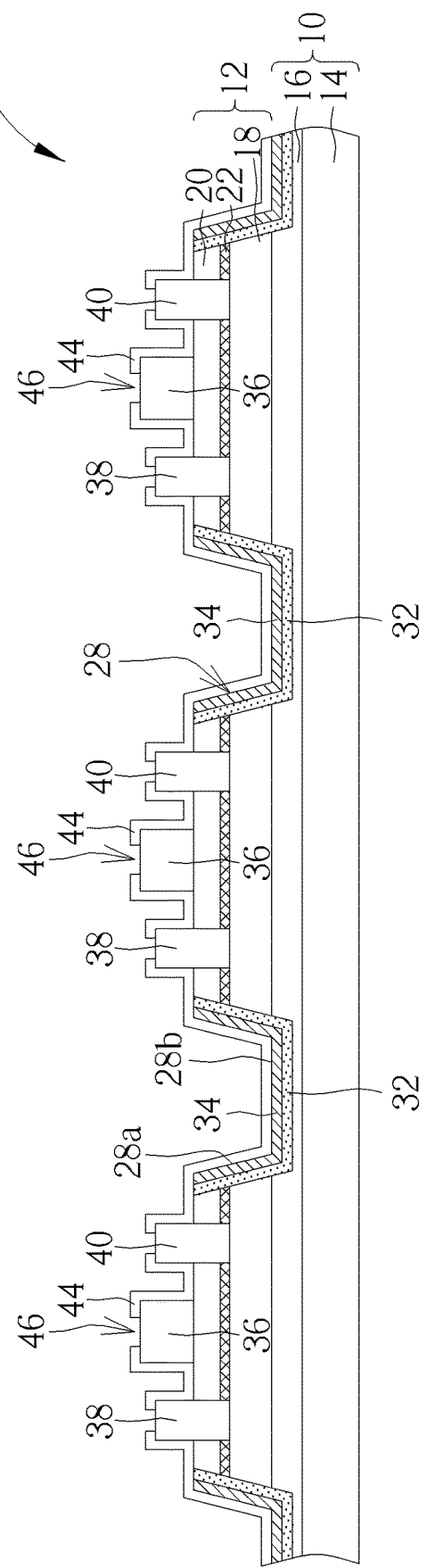

As shown in FIG. 9, a protective layer 44 is formed to cover the trench 28, the mesa structure 100, the gate electrode 36, the source electrode 38 and the drain electrode 40. Later, numerous holes 46 are formed in the protective layer 44 to expose the gate electrode 36, the source electrode 38 and the drain electrode 40.

Figure 10:
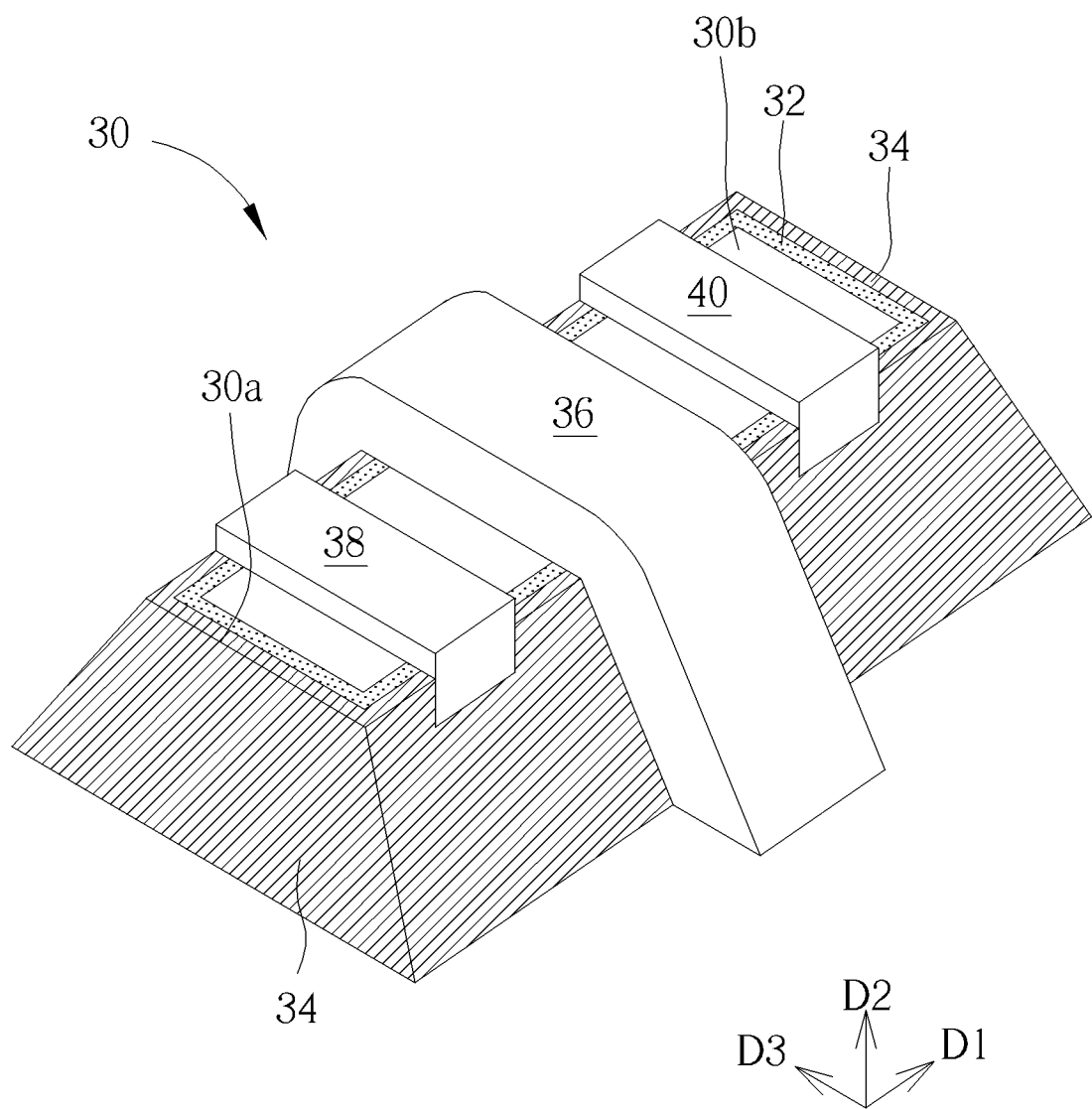

FIG. 10 depicts a step of forming a gate electrode after a source electrode and a drain electrode are completed. As shown in FIG. 10, the gate electrode 36 is not only formed on the top surface 30b of the mesa 30 but also covers the slope 30a (please refer to FIG. 7 for clear positions of the slope 30a and the top surface 30b). If there is not the lattice damage area 32 or the insulating layer 34, the gate electrode 36 will directly contact the 2DEG 22 (please refer to FIG. 3 for the position of the 2DEG 22). In the subsequent process, if the gate electrode 36 on the slope 30a is not removed entirely, a device problem will happen. A lattice damage area 32 is specially provided in the present invention to ensure that there is no 2DEG 22 in the slope 30a where the gate electrode 36 contacts. Moreover, the insulating layer 34 can further isolate the 2DEG 22 and the gate electrode 36. In this way, the 2DEG 22 and the gate electrode 36 are certainly completely isolated from each other.

FIG. 4 depicts a mesa structure according of a preferred embodiment of the present invention. FIG. 5 depicts a three-dimensional diagram of a mesa and a lattice damage area shown in FIG. 4. A sectional view taken along a line BB' in FIG. 5 corresponds to the mesa at the middle of FIG. 4. Please refer to FIG. 4 and FIG. 5, a mesa structure 100 includes a substrate 10. Numerous mesas 30 protrude from the substrate 10. Each of the mesas 30 has the same structure. A single mesa 30 will be described as an example in the following description. The mesa 30 can be a three-dimensional trapezoid, a truncated cone (as shown in FIG. 11) or a truncated ellipse cone (not shown). The mesa includes a slope 30a, a top surface 30b and a bottom 30c. The top surface 30b and the bottom 30c are parallel to each other. The area of the top surface 30b is smaller than the area of the bottom 30c. The slope 30a surrounds the top surface 30b and the bottom 30c. A lattice damage area 32 is disposed at the inner side of the slope 32a. The mesa 30 includes semiconductor stacked layer 12. The semiconductor stacked layer 12 includes at least two different III-V semiconductor layers such as a gallium nitride layer 18 and an aluminum gallium nitride 20. A 2DEG 22 is generated in the gallium nitride layer 18 and the aluminum gallium nitride layer 20. The lattice damage area 32 is formed by part of the gallium nitride layer 18 and part of the aluminum gallium nitride layer 20. The lattice damage area 32 includes nitrogen, oxygen, hydrogen, fluorine, helium, argon, magnesium, zinc, phosphorus, iron, krypton, xenon-131, boron or arsenic. Because the wurtzite-type lattice structures of the gallium nitride layer 18 and the aluminum gallium nitride layer 20 are damaged, there is no 2DEG 22 in the lattice damage area 32. A thickness of the lattice damage area 32 is smaller than 50 nanometers.

According to another preferred embodiment of the present invention as shown in FIG. 6 and FIG. 7, the mesa structure 100 can further includes an insulating layer 34 disposed at outside of the lattice damage area 32. The insulating layer 34 can be an oxide layer or a nitride layer, such as silicon nitride, silicon oxide, aluminum oxide or aluminum nitride.

According to yet another preferred embodiment of the present invention as shown in FIG. 8, a gate electrode 36, a source electrode 38 and a drain electrode 40 can be disposed on the mesa structure 100. The gate electrode 36 is disposed on the top surface of the aluminum gallium nitride layer 20. The source electrode 38 and the drain electrode 40 are embedded into the semiconductor stacked layer 12. Moreover, the source electrode 38 and the drain electrode 40 are respectively disposed at two sides of the gate electrode 36. The mesa structure 100, the gate electrode 36, the source electrode 38 and the drain electrode 40 form an HEMT 42.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a semiconductor structure with a mesa structure, comprising:
    providing a substrate and a semiconductor stacked layer covering the substrate;
    etching the semiconductor stacked layer to form a plurality of trenches, wherein the semiconductor stacked layer disposed between two of the trenches adjacent to each other forms a mesa;
    bombarding the trenches to form a lattice damage area in two sidewalls and a bottom of each of the trenches; and
    after forming the lattice damage area, forming an insulating layer at a surface of each of the trenches, wherein the insulating layer is formed by using an oxidation process or a nitridation process.

2. The fabricating method of a semiconductor structure with a mesa structure of claim 1, wherein a thickness of the insulating layer is smaller than 5 nanometers.

3. The fabricating method of a semiconductor structure with a mesa structure of claim 1, further comprising:
    after forming the lattice damage area, forming a gate electrode, a source electrode and a drain electrode on the mesa; and
    forming a protective layer covering the trenches, the mesa, the gate electrode, the source electrode and the drain electrode.

4. The fabricating method of a semiconductor structure with a mesa structure of claim 1, wherein when bombarding the trenches, nitrogen, oxygen, hydrogen, fluorine, helium, argon, magnesium, zinc, phosphorus, iron, krypton, xenon-131, boron or arsenic is used to bombard the sidewalls and the bottom.

5. The fabricating method of a semiconductor structure with a mesa structure of claim 1, wherein the mesa comprises a III-V semiconductor stacked layer.

6. The fabricating method of a semiconductor structure with a mesa structure of claim 1, wherein there is not any two dimensional electron gas within the lattice damage area.

7. The fabricating method of a semiconductor structure with a mesa structure of claim 1, wherein a thickness of the lattice damage area is smaller than 50 nanometers.

8. A fabricating method of a semiconductor structure with a mesa structure, comprising:
    providing a substrate and a semiconductor stacked layer covering the substrate;
    etching the semiconductor stacked layer to form a plurality of trenches, wherein the semiconductor stacked layer disposed between two of the trenches adjacent to each other forms a mesa;
    bombarding the trenches to form a lattice damage area in two sidewalls and a bottom of each of the trenches;
    after forming the lattice damage area, forming a gate electrode, a source electrode and a drain electrode on the mesa; and
    forming a protective layer covering the trenches, the mesa, the gate electrode, the source electrode and the drain electrode.

9. The fabricating method of a semiconductor structure with a mesa structure of claim 8, wherein when bombarding the trenches, nitrogen, oxygen, hydrogen, fluorine, helium, argon, magnesium, zinc, phosphorus, iron, krypton, xenon-131, boron or arsenic is used to bombard the sidewalls and the bottom.

10. The fabricating method of a semiconductor structure with a mesa structure of claim 8, wherein a thickness of the lattice damage area is smaller than 50 nanometers.

* * * * *